United States Patent [19]

Estrada et al.

[11] Patent Number: 5,508,702
[45] Date of Patent: Apr. 16, 1996

[54] BICOMS DIGITAL-TO-ANALOG CONVERSION

[75] Inventors: Julio R. Estrada, South Portland; Ray A. Mentzer, Portland, both of Me.

[73] Assignee: National Semiconductor Corp., Santa Clara, Calif.

[21] Appl. No.: 261,716

[22] Filed: Jun. 17, 1994

[51] Int. Cl.$^6$ ............................................. H03M 1/80
[52] U.S. Cl. ................................. 341/136; 341/153
[58] Field of Search ............................. 341/135, 136, 341/144, 153, 133

[56] References Cited

U.S. PATENT DOCUMENTS

| | | | |
|---|---|---|---|
| 3,842,412 | 10/1974 | Spofford, Jr. | 341/153 |
| 3,961,326 | 6/1976 | Craven | 341/153 |
| 4,064,506 | 12/1977 | Cartwright, Jr. | 341/135 |
| 4,431,986 | 2/1984 | Haque et al. | 341/127 |
| 4,583,076 | 4/1986 | Luschnig | 341/153 |
| 4,594,577 | 6/1986 | Mao | 341/135 |
| 4,602,244 | 7/1986 | Takayanagi et al. | 341/134 |
| 4,701,694 | 10/1987 | Penney et al. | 323/317 |
| 5,001,482 | 3/1991 | Chung et al. | 341/136 |
| 5,008,671 | 4/1991 | Tuthill | 341/136 |
| 5,043,730 | 8/1991 | Obinata | 341/153 |

Primary Examiner—Marc S. Hoff
Attorney, Agent, or Firm—Chris A. Caseiro; Thomas L. Bohan

[57] ABSTRACT

A digital-to-analog conversion device that has one or more conversion cells, each cell coupled to a master voltage source and to a specific binary input element. The conversion cells include binary-weighted or binary-sized output transistors such that each output transistor, when called upon, delivers a unique analog output current corresponding to a particular binary signal. The master potential provided by a stable source is supplied to the control nodes of the output transistors so that the potential at those control nodes remains constant. Switching on and off of the output transistors is achieved by regulating the sources of those transistors rather than their gates. By regulating the operation of the output transistors at their sources, the present invention provides a digital-to-analog converter and a conversion method with little switching noise and minimal switching delay. The introduction of bipolar transistor devices to regulate the source and control nodes of the MOS output transistors utilizes the best characteristics of both transistor types to enhance converter monotonicity and linearity, in addition to reducing noise.

20 Claims, 6 Drawing Sheets

BICOMS DIGITAL-TO-ANALOG CONVERSION

CROSS REFERENCE TO RELATED APPLICATION

This invention is related to the Julio R. Estrada and Ray A. Mentzer U.S. patent application Ser. No. 07/984,172, filed for an invention entitled AUTOMATIC SELECTION OF AN OPERATING FREQUENCY IN A LOW-GAIN, BROADBAND PHASE LOCK LOOP SYSTEM on Nov. 23, 1992, and assigned to the same Assignee.

BACKGROUND OF THE INVENTION

1. Field of the Invention

The present invention relates to a circuit and method for the conversion of digital signals to analog signals (digital-to-analog converter, D-to-A converter, or "DAC"). More particularly, the present invention relates to a DAC that provides high accuracy, linearity, and monotonicity by mirroring currents in a circuit. The present invention includes the use of a master device connected in parallel to a plurality of binary (digital)-weighted devices that are turned on and off by the binary signals to be converted. The system of the present invention provides current outputs that correspond to the particular binary signals received. These "weighted-current" outputs are delivered so that an analog output voltage is developed that is proportional to the number corresponding to the digital signal at the input. The present invention can be fabricated using semiconductor fabrication steps already in use.

2. Description of the Prior Art

DACs are used in a wide variety of applications. They have long been used to translate logic signal inputs into corresponding analog signal outputs. They are used in oscilloscopes, computer-controlled devices, and other equipment requiring analog/digital interfacing devices. In effect, a DAC operates by linking a plurality of parallel circuit lines together such that when one of the lines is switched "on" by a digital input signal, current is delivered through the line into a node that can be defined as a current summing node. That is, the current summing node is the common output node for the parallel lines. The summed current—an analog signal—is then translated by well known conversion means into an output voltage which is the analog voltage output. (Of course, the output can be an analog current output as well.) The parallel circuit lines are usually coupled to a common high-potential power rail, and each has a distinct impedance. As a result, each of the parallel lines provides a distinct current to the common current output node, corresponding to the digital input signal used to turn that particular line on.

In general, DACs can be categorized by their speed of operation: those that are "high" speed and those that are "low" speed. E.g., high-speed DACs are required for video applications, where the conversion must occur rapidly in order to provide a smooth display of moving figures. In contrast, low-speed DACs maybe used in compact disk drives, where a minimal delay in conversion will not affect output. In those DAC applications which do not require high-speed conversion, acceptance of a small delay in conversion can permit the use of relatively simple, highly accurate, and extremely reliable DACs that can be implemented in modern semiconductor fabrication processes. In both types it is desirable to have monotonicity; that is, to have the DAC output increase for any increase in the number corresponding to the digital input over the entire range of operation. It is also desirable to have a DAC that provides a straight-line translation from digital input to voltage output; that is, linearity. Further, it is desirable to have a DAC that minimizes the noise problems associated with prior DACs.

A number of prior semiconductor DACs were operated through the use of voltage- or capacitor-scaling techniques. In voltage-scaling conversion, a voltage tap line is placed between each resistor in a series of equivalent resistors, with each tap line having a switch controlled by a binary input signal corresponding to a particular bit number. The number of resistors in the series is dependent upon the size of the bit number. Thus, for an eight-bit voltage-scaling DAC, there would have to be $2^8$ or 256 resistors. An advantage of the voltage-scaling DAC is that it provides monotonicity. This is because the voltage at a particular "tap" cannot be less than the voltage associated with the subsequent tap and so there is no drop in the resultant output voltage as the digital input value increases. A disadvantage of a voltage-scaling device fabricated using semiconductor components is that the circuitry involved exhibits problems in conversion speed. Specifically, each internal node of the circuit gives rise to a particular parasitic capacitance such that each line is not simply resistive. The RC time constants associated with these parasitic capacitances are difficult to control under present semiconductor fabrication techniques in a way that yields accurate, reliable DACs.

Capacitor-scaling DACs involve the use of a plurality of capacitors connected in parallel with binary inputs that control the switches of individual capacitor lines. Each of the capacitors of the DAC has a unique capacitance in relation to the other capacitors of the device so that a particular capacitance line outputs a unique charging current. Switch connections divide the potential applied to the entire capacitor array as a function of digital input. As a result, only one capacitor line is conducting at a time. A selected capacitor line of the array having a unique capacitance, provides a unique current to a current summing point that is translated into an output voltage corresponding to the digital input signal.

A significant problem associated with the capacitor-scaling method is that the ratio between the capacitance of the capacitor corresponding to the least significant bit (00000001 or "1" in an eight-bit DAC) and the capacitance of the capacitor corresponding to the most significant bit (10000000 or "128" in the eight-bit DAC) must be extremely large in order to develop sufficient differences in the current outputs related to particular digital inputs. The large capacitance differences required in suitable DACs of this type are very difficult to produce in the very small layouts of present semiconductor devices, particularly since a minimum capacitance is required in order to generate a significant current for the least significant bit. In the field of semiconductor technology the ability to reliably produce such capacitances, given the parasitic capacitances associated with semiconductor devices, in the ratios required is extremely difficult. As a result, capacitor-scaling DACs are relatively inaccurate.

Therefore, what is needed is a digital-to-analog converter that provides monotonicity, linearity, and accuracy. What is also needed is a DAC that avoids the problems associated with the prior voltage-scaling and current-scaling devices of the prior art, in particular the problems associated with parasitic capacitances, including conversion delays and inaccuracy. Further, what is needed is a DAC that exhibits the noted attributes of monotonicity, linearity, and accuracy, and that can be fabricated utilizing present semiconductor device fabrication techniques. Yet further, what is needed is a DAC that minimizes the noise associated with switching and other changes in the operation of the device.

SUMMARY OF THE INVENTION

It is an object of the present invention to provide a digital-to-analog semiconductor converter that can be readily fabricated utilizing present semiconductor fabrication techniques. It is also an object of the present invention to provide a DAC that exhibits monotonicity, linearity, accuracy, and reliability. It is another object of the present invention to provide a DAC that avoids the problems related to parasitic capacitances and variable RC time-constant delays associated with individual components of voltage-scaling and capacitor-scaling devices. It is a further object of the present invention to provide a DAC with reduced noise problems, including those noise problems related to the switching on and off of individual line components as digital input signals change.

These and other objects are achieved in the present invention through the application of current-mirroring techniques in a DAC wherein currents corresponding to specific binary input signals are selectively directed into a common current node. The current at that node is then converted to an analog voltage output which is unique and which relates to a specific binary input signal. The unique currents are produced by sizing individual output transistors to correspond to the particular binary signal. BiCMOS technology utilized in the present invention produces a DAC that takes advantage of the speed and low-potential switching characteristics of bipolar transistors and the low-power requirements of MOS transistors.

In general terms, a master current is established in a master transistor so that a master control voltage is provided to each line of an array of parallel current-supplying lines. These current-supplying lines each provides a current value that corresponds to a particular digital input signal. Each of the current-supplying lines includes a system transistor that is dimensionally sized in proportion to the master transistor so that the output of a particular system transistor, when "on," is proportional to the output of the master transistor. A particular system transistor provides the proportional current to the analog summation point when a digital input signal to be converted turns that system transistor on. One or more outputs of the system transistors are summed at the summation point so that for an n-size bit $2^n$ different analog output voltages (or currents) may be supplied.

Unlike prior devices that may include a combination of master transistor(s) and system transistors, the present invention involves reference to the high-potential rail of the circuitry so that devices fabricated using conventional production techniques can be used to make a DAC that operates over a wide range of frequencies. Further, the present invention involves a "steering" of the high-potential node(s) of the system transistor(s), rather than a switching on and off of those transistors at their control nodes. In this way, switching delays and switching noise are both reduced.

While the DAC of the present invention may be used for a variety of purposes, it is particularly applicable to broadband phase lock loop systems such as that described in the referenced application of the same-named inventors, assigned to the same assignee, and entitled "Automatic Selection Of An Operating Frequency In A Low-Gain, Broadband Phase Lock Loop System." In that system the DAC of the present invention provides an analog voltage output that is dependent upon particular digital input commands. The analog voltage output of the DAC is then supplied to stages of a ring oscillator of the phase lock loop system where it is compared to reference signals.

It is the use of transistor devices that are regulated at their high-potential nodes instead of voltage-scaling or capacitor-scaling devices that enables the present invention to provide digital-to-analog conversion with monotonicity, linearity, accuracy, and reliability. In addition, the high-potential node bias-voltage swing of the system transistor(s), as supplied by the master transistor, is provided in order to produce faster switching from the conversion of one signal to the next with reduced noise. Further, the present invention provides a DAC that is much simpler than the present complex DACs. It is also designed to provide the desirable characteristics noted while minimizing the amount of space taken up on a chip. These novel features and others will become apparent upon review of the detailed description of the preferred embodiment and the appended claims.

DETAILED DESCRIPTION OF THE PREFERRED EMBODIMENT OF THE PRESENT INVENTION

Figure 1:
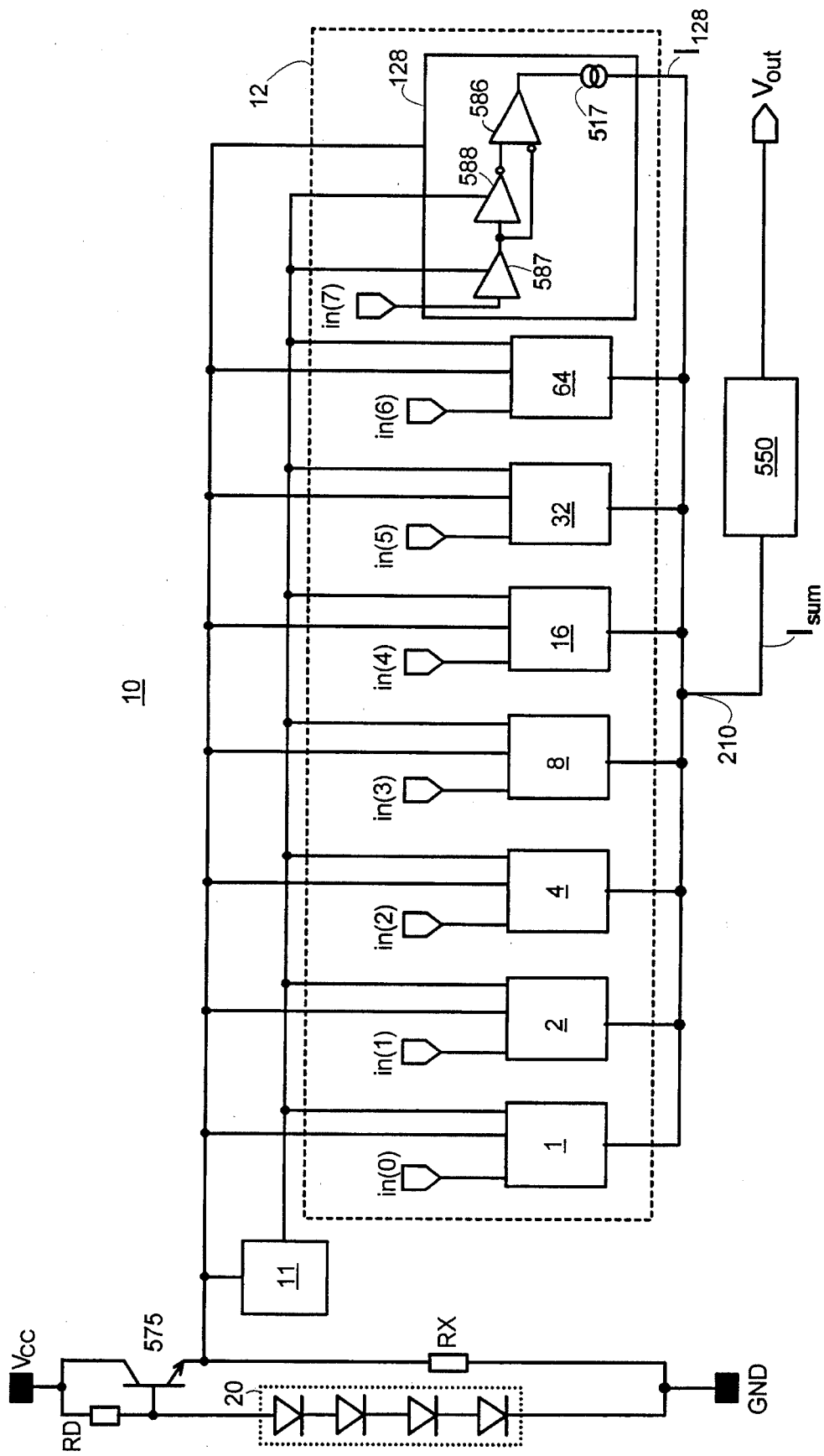
FIG. 1 is a simplified schematic diagram of an eight-bit DAC of the present invention, including a generalized view of one cell of the DAC.

A D-to-A Converter (DAC) 10 of the present invention is illustrated in FIGS. 1–4. It is an improvement upon prior DACs in that it uses BiCMOS technology to provide immunity from noise transients. In particular, this is done by using as a regulating means the potential at the high-potential node of system transistors, rather than that at the control nodes of those system transistors. This permits faster, more uniform, switching of those system transistors. In that way, switching is achieved via a low-impedance path rather than through the type of high-impedance generally associated with manipulation of a device at its control node.

In general, the present DAC 10 includes a master transistor section 11 that controls a system transistor section 12. The system transistor section 12 includes a plurality of individual conversion cells, corresponding in number to the number of digital conversion possibilities. For example, in an eight-bit DAC there are eight conversion cells 1, 2, 4, 8, 16, 32, 64, and 128, as illustrated generally in FIG. 1, with each conversion cell corresponding to one of the digital bits.

The least significant bit (or the "first" number place in the eight-bit number, e.g., 00000001) corresponding to first conversion cell 1 and the most significant bit (or the "eighth" place in the eight-bit number, e.g., 10000000) corresponding to last conversion cell 128. Each conversion cell outputs via a system transistor a particular current that is related to the particular digital input signal controlling it. The current from one or more of the conversion cells is delivered to current summing lead 210 and then converted through sense amplifier 550 to a voltage applied at voltage output node $V_{out}$. It is to be understood that the present invention is directed to the design of the conversion cells and their control by the master transistor. Therefore, the specific number of cells described in the present discussion is not a limiting factor and the present invention may be incorporated into any number of different types of decoding applications.

As previously stated, the DAC 10 of FIG. 1 has eight binary-weighted current segment cells, each corresponding to a particular eight-bit binary input signal. The current segment cells begin with cell 1 corresponding to a binary value of 00000001. That is, for a logic high (H) input only at cell 1, with all other cell inputs at logic low (L), the number 1 is represented as a binary value in an eight-bit string by 00000001. In a similar way, the remaining cells are as follows: cell 2 corresponds to a binary value of 00000010, cell 4 corresponds to binary value 00000100, cell 8 corresponds to binary value 00001000, and so on, up to cell 128 which corresponds to binary value 10000000. The particular cell designations are used to identify the difference in current level supplied by the particular cells.

Each of the noted cells includes the components shown in some detail in the box of cell 128 and they are all powered via high-potential power rail $V_{cc}$. Alternatively, in order to minimize or eliminate noise effects caused by swings of $V_{cc}$, the high-potential nodes of the components of the cells may be coupled to a voltage-regulating element that includes regulating transistor 575. The base of transistor 575 is coupled to a node between a diode-biasing resistor RD and a diode set 20. Through this connection the base of transistor 575 is linked to the more stable low-potential power rail GND. Tail resistor RX coupled between the emitter of transistor 575 and low-potential power rail GND ensures that the components of the current cells are kept out of saturation. If, for example, diode set 20 includes four diodes as shown, then the emitter node of transistor 575 would be at a potential of three diode drops above the potential of GND for a bipolar transistor having a base-to-emitter drop $V_{BE}$ that is about the same as the drop across a diode of the type shown. In this alternative embodiment the present invention is more stable than if the cell components were coupled directly to $V_{cc}$. In addition, voltage swings to be effected are reduced, resulting in a system with tighter switching tolerances.

With reference to cell 128 depicting the components found in each of the cells, it can be seen that a binary input signal in(7) is manipulated through several stages of cell 128 in order to produce a current output signal $I_{128}$ to be transmitted to current summing lead 210. Specifically, input signal in(7) is transmitted to inverter pair 587, 588, which deliver a pair of signals consisting of the "true" signal and its complement to differential gate 586. Differential gate 586 then turns current source 517 on or off as a function of the binary input signal in(7). Current source 517 is designed so that when it is on it transmits the current output signal $I_{128}$. Each of the remaining cells operates in the same manner. The current representing the particular summed output from the conversion cell set ($I_{sum}$) at lead 210 may be transmitted to sense amplifier 550 shown simply as a box in FIG. 1. A detailed description of the sense amplifier 550 can be found in the referenced patent application of the same applicants and entitled "Automatic Selection Of An Operating Frequency In A Low-Gain, Broadband Phase Lock Loop System," incorporated herein by reference. Briefly, the sense amplifier 550 develops an output analog voltage at $V_{OUT}$ which is proportional to the summed output current signal at lead 210 and is therefore also proportional to the number represented by the particular binary input signal delivered to the conversion cell set of the DAC. Of course, the current $I_{sum}$ may alternatively be output to any device utilizing a variable analog output.

Figure 2:
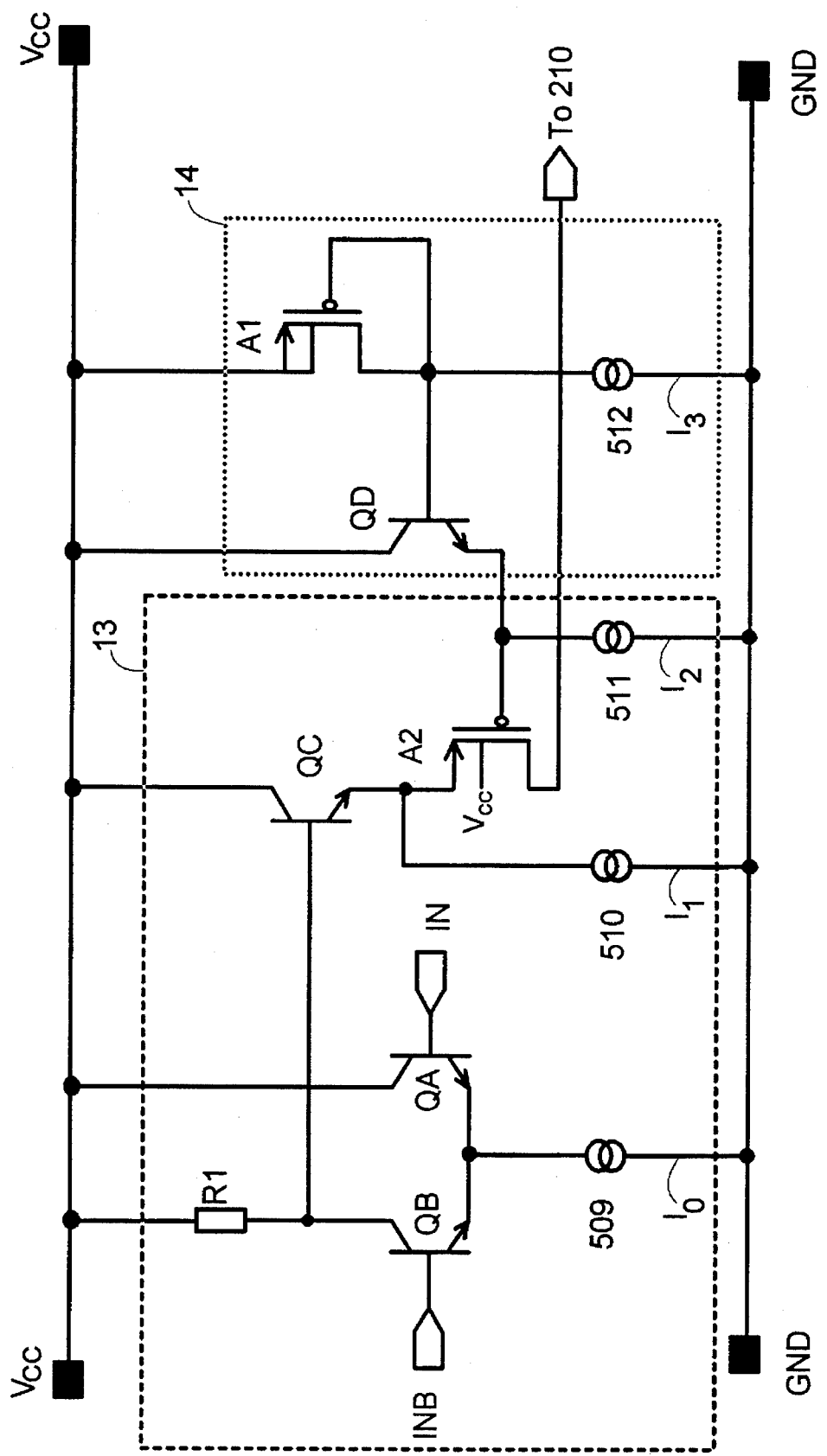
FIG. 2 is a simplified schematic diagram of the combination of a general master transistor system and a general output stage of one cell of the DAC of the present invention.

A simplified schematic diagram showing generally the basic operation of a combination of the master transistor section 11 and any one of the conversion cells is presented in FIG. 2. A first input transistor QA and a second input transistor QB form the first section of a first system stage 13. A first signal input IN is coupled to the control node of the first input transistor QA and a second signal input INB is coupled to the control node of the second input transistor QB wherein IN and INB provide complementary signals to the input section of the first system stage 13. A resistor R1 is coupled between high-potential power rail $V_{cc}$ and the high-potential node of the second input transistor QB, while the high-potential node of first input transistor QA is coupled directly to $V_{cc}$. Of course, resistor R1 may alternatively be coupled between $V_{cc}$ and the high-potential node of transistor QA, with the high-potential node of transistor QB coupled directly to $V_{cc}$. In this alternative coupling for QA and QB, one would in effect be starting at a maximum current when only the least significant bit is "on," and reducing that current as other system transistors are directed "on." In the embodiment shown in the drawings, one starts at the minimum current and adds to that current level as system transistors are directed on. The coupled low-potential nodes of QA and QB are coupled to ground via an independent current source 509 that develops a current $I_o$.

The control node of source-controlling transistor QC is coupled to the low-potential node of resistor R1 so that when transistor QB is on, the potential at the control node of transistor QC is reduced by the voltage drop across R1. This provides a reduction in the voltage level at the low-potential node of transistor QC. (Resistors placed between the high-potential rail and the high-potential node of a device are sometimes referred to as "swing" resistors for this reason.) The high-potential node of QC is coupled directly to $V_{cc}$ and the low-potential node of QC is coupled to a current source 510 that develops a current I4.

The low-potential node of source-controlling transistor QC is also coupled to a source node of a system output transistor A2 of first system stage 13. The drain node of output transistor A2 is coupled to the summing node described earlier. That is, output transistor A2 provides the current used to develop an analog signal based upon the digital input signal delivered to it via input set IN and INB. Of course, the number of output transistors like transistor A2 capable of delivering output current is dependent upon the number of digital inputs, such as the eight cells shown in FIG. 1—of which stage 13 is one cell. Output transistor A2 is sized to provide to the summing lead 210 a current of particular value that corresponds to the place value of the digital input bit signal.

The control node of output transistor A2 connected to a reference control input stage 14 of the master transistor section 11 that provides a constant, stable control signal sufficient to keep the control node of transistor A2 at a fixed potential. In the embodiment of the present invention illustrated in FIG. 2, the reference control input stage 14 includes a first reference transistor A1 having a high-potential node coupled to $V_{cc}$ and a low-potential node coupled to a current source 512 that develops a current $I_3$. The control node of first reference transistor A1 is tied to its low-potential node so that A1 is always on. The low-potential node of A1 is also coupled to the control node of a secondary reference transistor QD which is also always on. It is to be understood that reference control input stage 14 can be designed to mirror a constant, stable control signal to the control nodes of each of the output system transistors of each of the conversion cells shown in FIG. 1, provided supplemental secondary reference transistors are included to supply and divert current adequately. Additionally, although transistors A1 and A2 are shown as PMOS transistors, they may alternatively be NMOS transistors having source nodes coupled to GND. Further, it may be possible to employ bipolar transistors; however, since bipolar transistors react logarithmically rather than linearly to voltage swings, minimal voltage swings would effect much greater differences in output currents than if MOS transistors were employed. For this reason, MOS transistors are preferable.

Secondary reference transistor QD, in combination with the first reference transistor A1, is designed to provide a fixed constant potential at the control node of the transistor A2, as previously indicated. That fixed constant potential is at a level such that when the source node of A2 is directed to a relatively higher potential by the operation of transistors QA and QC, A2 is, in effect, delivering current. When transistor QB is conducting, the source node of A2 is essentially at the potential of the control node of A2, and so A2 is, in effect, on hold and thus not delivering current. Through this novel coupling, output transistor A2 actually always on, and there is simply a steering of the potential at its high-potential node. That potential is in a range corresponding to the drop across resistor R1. In this way, the operation of the output transistors of each cell is much faster and imparts much less noise than if the operation of those transistors was effected at their control nodes.

Secondary reference transistor QD is also designed to reduce the switching noise sensitivity of first reference transistor A1 by pulling or forcing away any noise fluctuations at its low-potential node and thereby also pulling such fluctuations away from the control node of transistor A1. The low-potential node of secondary reference transistor QD is also coupled to a current source 511 that develops a current $I_2$. Of course, it is to be understood that secondary reference transistor QD must be sized so as to be compatible with the charging and discharging requirements of the first reference transistor A1. It is to be noted that secondary reference transistor QD can be a plurality of transistors performing the current-sourcing task of that section of the reference control input stage 14 of the circuit described. Current source 511 must be designed to be sufficiently robust so that the capacitance from the high-potential node of transistor A2 to the control node of transistor A2 can be quickly discharged. That is important under the condition when the increased capacitance of transistor A2 caused by a rise in the potential at the high-potential node of transistor A2 "lifts" the potential at the control node of that transistor. If that capacitance and corresponding increased potential at the control node is not discharged quickly, the switching rate of the output transistor A2 is slowed.

Current source 511 and the other current sources shown generally in FIG. 2 as components 509, 510, and 512 can be provided in any number of well-known ways. In the preferred embodiment of the present invention, each of the noted current sources includes a current regulator set having one or more current-regulating transistors and may have one or more tail resistors, to be described in more detail in the specific embodiments of the DAC of the present invention.

Figure 3A:
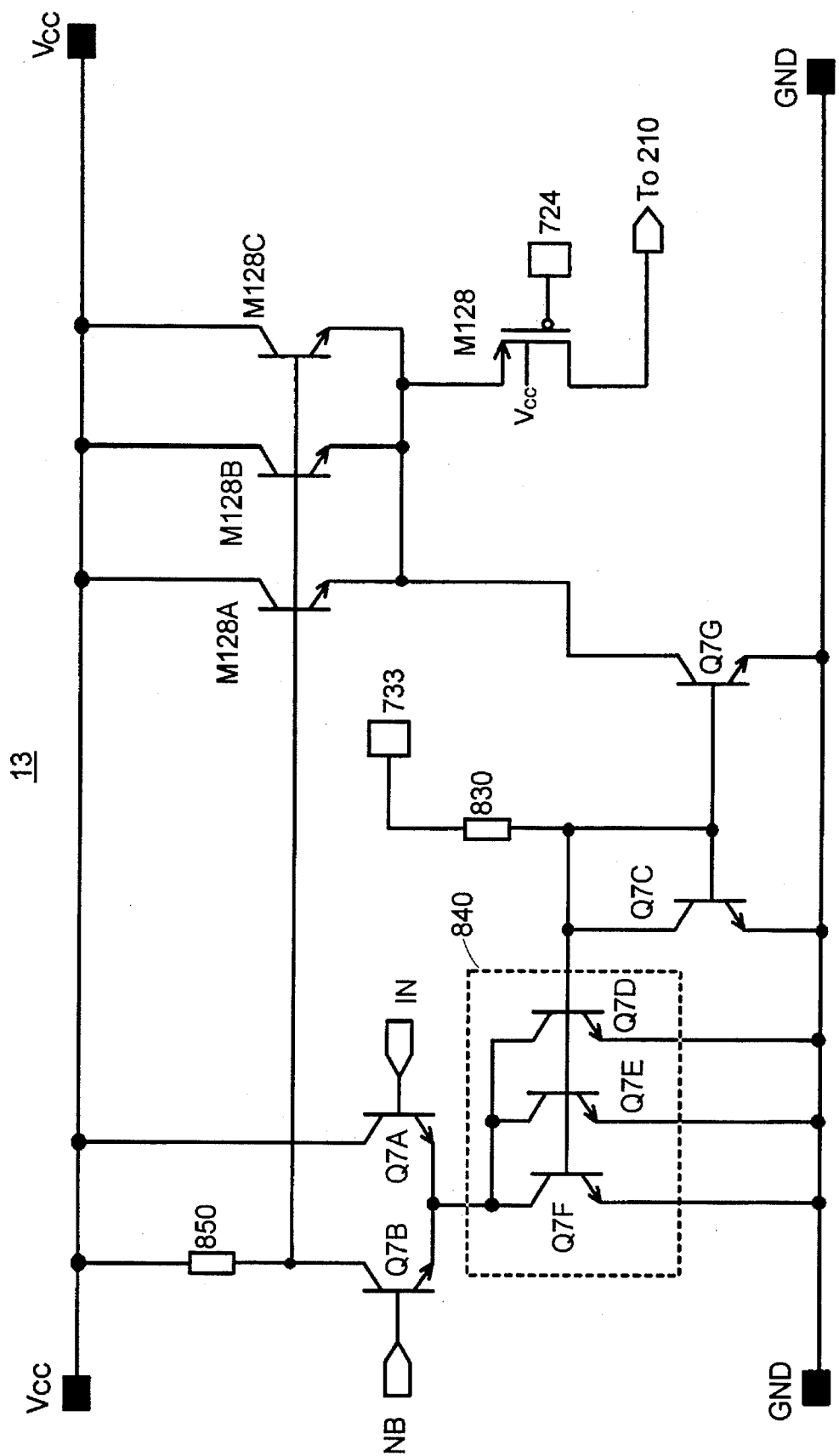
FIG. 3A is a simplified schematic diagram of an embodiment of the output stage of one cell of the DAC of the present invention.

FIG. 3A illustrates an embodiment of the system stage 13 of FIG. 2, showing the design of cell 128 specifically. In FIG. 3A it can be seen that cell 128 of FIG. 1 includes output transistor M128, the low-potential node of which is coupled to current summing lead 210. In a very general way, transistor M128 is essentially current source 517 of FIG. 1. In essence, the current output of cell 128 relates to the binary input signal in(7) by the size of transistor M128. With the same master potential mirrored by master transistor section 11 to each cell, transistor M128 is sized to be two times larger than the output transistor of cell 64, four times larger than the output transistor of cell 32, and so on, down to cell 1, which has an output transistor that is $\frac{1}{128}$ the size of output transistor M128. For example, in the preferred embodiment of the invention, transistor M128 may have an active area of 1280 microns. The output transistor of cell 64 would thus have an active area of 640 microns, and so on. Of course, those skilled in the art will understand that those active area dimensions may be obtained in a variety of ways, including the use of a single active area or a combination of isolated active areas operating in unison. Through this technique, the impedance of output transistor M128 is essentially only $\frac{1}{128}$ the impedance of the output transistor of cell 1. With all cells at the same high potential provided by $V_{cc}$ (or some pre-set reference voltage provided by a voltage-regulating transistor such as transistor 575 as noted earlier) less the potential drop provided by that cell's source-controlling transistor, the resultant output current of a particular cell is a function of impedance of that particular cell's output transistor. Since output transistor M128 is designed with the lowest impedance, cell 128 produces the greatest output current, corresponding to the most significant bit at the input.

Figure 4:
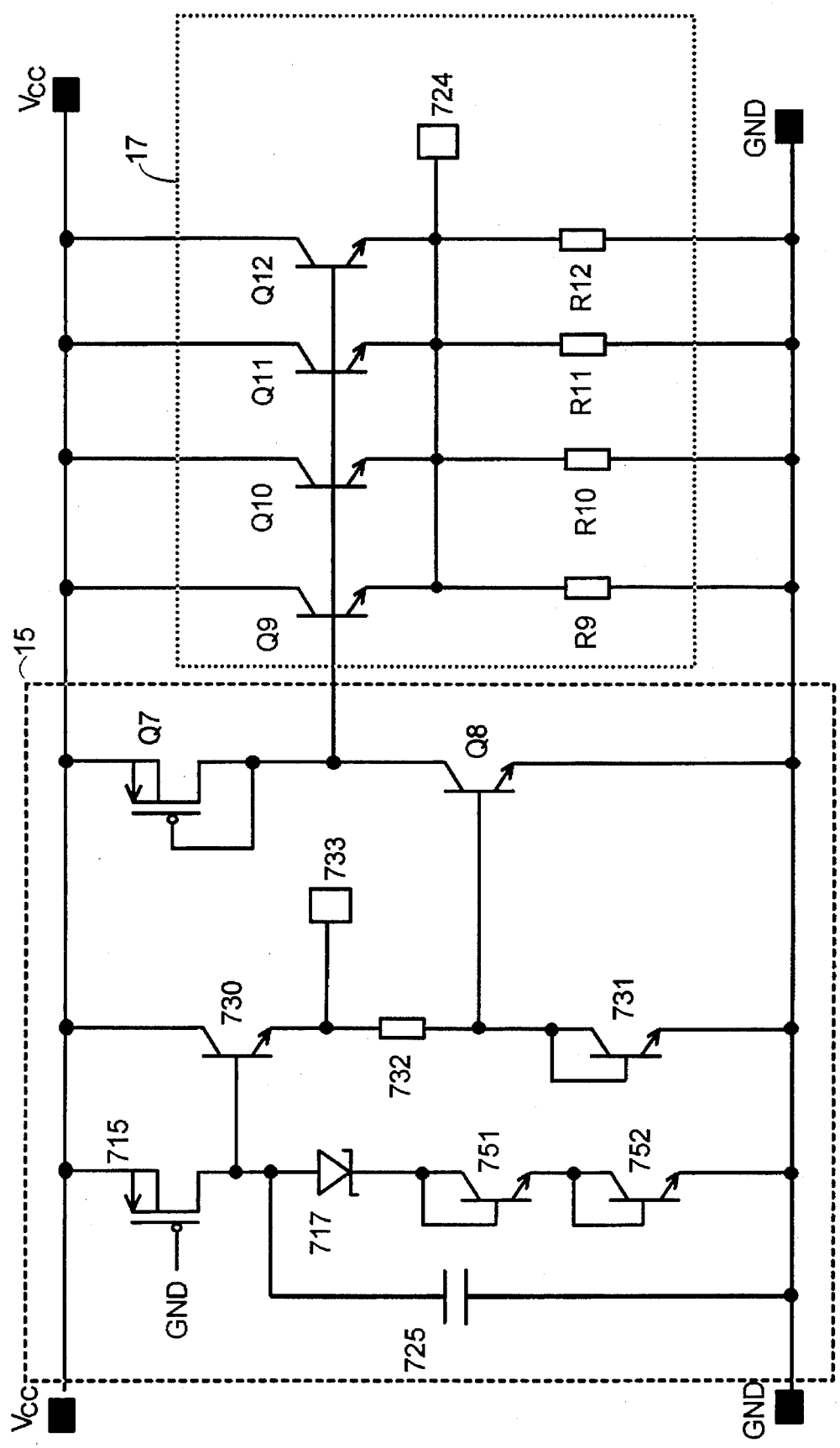
FIG. 4 is a simplified schematic diagram of a portion of the master transistor section of the DAC of the present invention.

Continuing with the particular cell embodiment shown in FIG. 3A, a reference input voltage is supplied to the control node of output transistor M128 at node 724 by a supplemental reference source of the master transistor section 11 to be described in detail in regard to FIG. 4. As previously noted, the low-potential node of transistor M128 is coupled to summation lead 210. (While not shown specifically, the low-potential nodes of the other output transistors of the other cells, cell 64, cell 32, cell 16, cell 8, cell 4, cell 2, and cell 1, are also coupled to summation lead 210, as shown generally in FIG. 1.) The high-potential node of transistor M128 is coupled indirectly to high-potential power rail $V_{cc}$ through a set of source-controlling transistors M128A, M128B, and M128C. Transistors M128A, M128B, and M128C are preferably bipolar emitter-follower transistors which are, of course, always on. That transistor set modulates or "steers" the potential at the high-potential node of output transistor M128, thereby making it possible to regulate the operation of transistor M128 more quickly. Referring back to the generalized circuit shown in FIG. 2, it can be seen that output transistor M128 corresponds to transistor A2 and that transistors M128A, M128B, and M1280 correspond to source-controlling transistor QC. Of course, while there are three transistors elements shown sourcing current to the high-potential node of output transistor M128, it is to be understood that it is simply necessary to provide a sufficient amount of current for the particular binary-weighted size of the output transistor so that there will be little or no delay in charging that transistor. Therefore, one or more larger transistors could be used instead of the three shown. Also, for the output transistors of the other cells, which are of smaller binary-weighted size, fewer and/or smaller source-controlling transistors would be needed to supply the particular output transistor. For example, the output transistor of cell 64 would only require half the equivalent transistor size of sourcing transistors M128A, M128B, and M128C.

Referring to the general cell circuit shown in FIG. 2 in relation to the system stage 13 of cell 128 shown in FIG. 3A, it can be seen that transistors Q7A and Q7B correspond to input transistors QA and QB respectively. That is, cell 128 includes transistors Q7A and Q7B receiving complementary input signals IN and INB respectively. Resistor 850 provides a reduction in the voltage level at the control nodes of transistors M128A, M128B, and M128C when transistor Q7B is conducting, so that that transistor set can be switched more quickly than would otherwise be possible. Current source 840 (including the transistor set Q7D, Q7E, and Q7F) operates as the current source for transistor pair Q7A and Q7B, in the same way as the generalized current source 509 shown in FIG. 2 functions for the emitter-coupled pair shown in that figure. Similarly, transistor Q7G is the current source for transistors M128A, M128B, and M128C, corresponding to current source 510 for transistor QC of FIG. 2. Of course, it is to be understood that the numbers and sizes of the noted current sources of FIG. 3A are dependent upon the particular cell of which they are a part. Therefore, there may be fewer current-source transistors and/or they may be of different sizes than those utilized in cell 128.

In order to ensure that current sources 840 and Q7G remain on as sinks for their respective transistor stages, the control nodes of transistors Q7D, Q7E, Q7F, and Q7G are kept at a constant potential: the potential at input 733 less the voltage drop across resistor 830 and less the base-to-emitter drop across transistor Q7C. That is, the voltage at the collector node of transistor Q7C is mirrored to the gates of the noted transistors of the current sources. Input 733 is received from a portion of the master transistor section 11 to be described in detail in reference to FIG. 4. Transistor Q7C is kept on by shorting its collector-to-base junction. As illustrated, the low-potential nodes of the current-sourcing transistor set 840 and transistor Q7G of FIG. 3A, as well as the low-potential node of transistor Q7C, are all coupled to the low-potential power rail GND. Those transistors may be coupled to GND via tail resistors that "load" the transistors so as to keep them out of saturation.

Figure 3B:
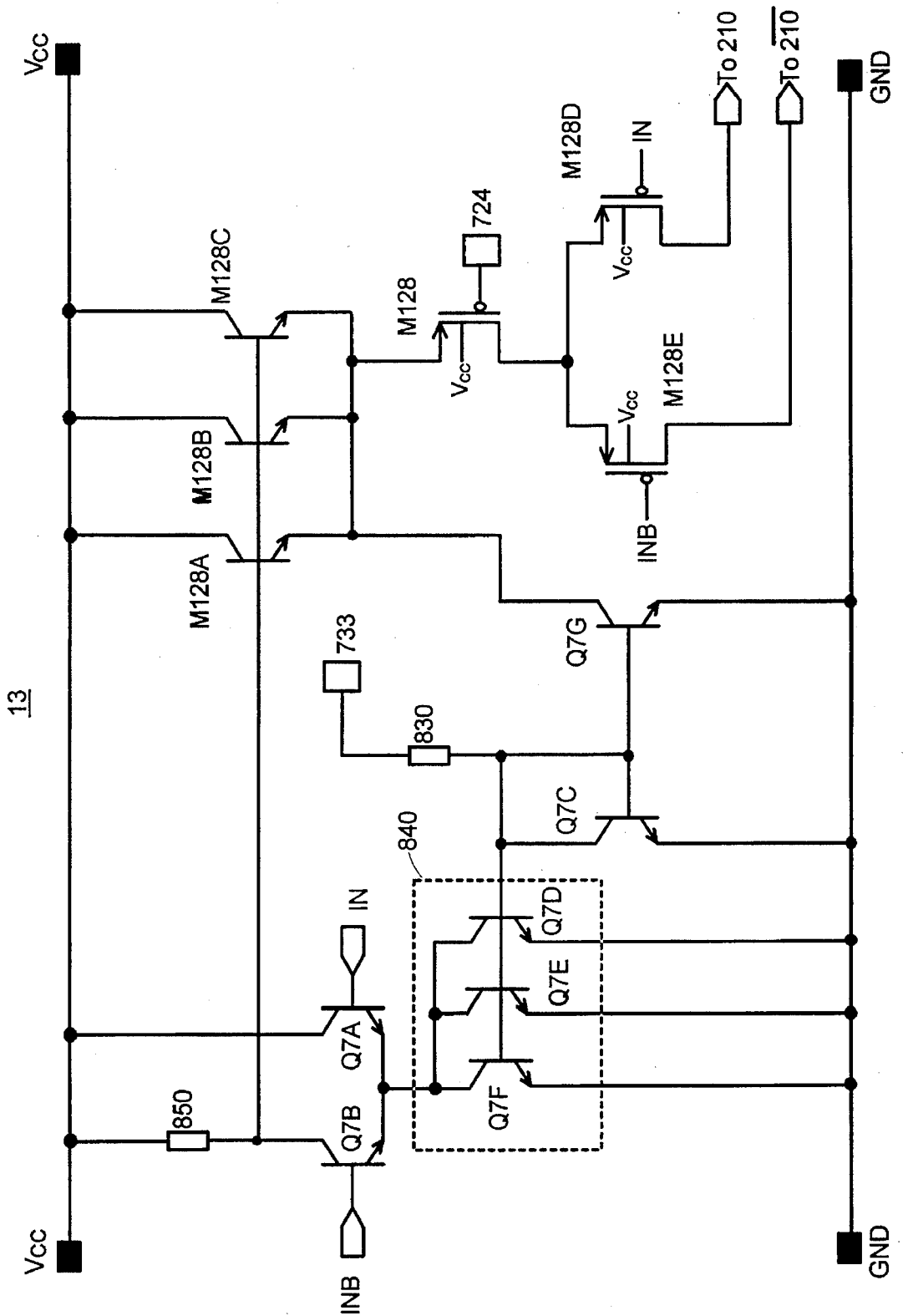
FIG. 3B is a simplified schematic diagram of an alternative embodiment of the output stage of FIG. 3A, showing an output summing current and its complement.

In an alternative embodiment of the device as shown in FIG. 3A, the system stage 13 may also include splitting stage 21 having transistors M128D and M128E, as illustrated in FIG. 3B. Transistor M128D has a high-potential node coupled to the low-potential node of transistor M128, and a low-potential node coupled to summation lead 210. The control node of transistor M128D is coupled to input signal IN. Transistor M128E has a high-potential node coupled to the low-potential node of transistor M128, a low-potential node coupled to a complementary summation lead 210, and a control node coupled to complementary input signal INB. The introduction of the splitting stage 21 provides the output current and its complement to two separate output lines. With each cell of the DAC having such a splitting stage, the DAC can provide two output voltages, one corresponding to the digital input signal and the other its complement.

The input 733 provided to the current sources designated as transistor set 840 and transistor Q7G in FIGS. 3A and 3B is obtained from a first controlling stage of the DAC circuit shown generally in FIG. 2. Preferably, the input 733 is a typical ECL temperature-compensation cell. The specific first controlling section 15 utilized with the cell 128 shown in FIGS. 3A and 3B is shown in FIG. 4 as a portion of the master transistor section 11. As seen in that figure, the input 733 is at a potential equal to the drop across Schottky diode 717 plus the drop across diode-wired transistors 751 and 752 less the $V_{BE}$ drop across transistor 730. It is to be understood that transistor 730 corresponds essentially with transistor 575 shown in FIG. 1. Generally and in the preferred embodiment of the present invention, the drop across diode 717 is about 0.6 V while the drop across each of the transistors is about 0.8 V. As a result, the ground-referenced, stable voltage at input 733 is about 1.4 V. Input 733 is provided with a stable supply unaffected by noise at the circuit input or on the power rails as a result of the design illustrated. Transistor 730 remains on throughout because its base node is constantly biased by the potential at the drain node of transistor 715 which operates essentially as a resistor. A parallel source for transistor 715 includes a series connection of Schottky diode 717 and transistors 751 and 752 in parallel with capacitor 725.

The stable continuous supply voltage provided to the current-source transistor set 840 and to current-source transistor Q7G of FIGS. 3A and 3B via input 733 can be produced in any number of other well-known ways. That same stable continuous supply voltage provided by the operation of transistors 715 and 730 also ensures that a constant stable reference voltage is supplied to the gate of transistor M128 at node 724, as shown in FIGS. 3A and 3B. As illustrated in FIG. 4, current source transistor Q8 remains on because it is coupled to the emitter node of transistor 730 via resistor 732. In that way, transistor Q8 operates in the same fashion that transistor Q7G does. Constant current source transistor Q8 acts as a regulator for transistor Q7, which is a key component of the present invention.

As illustrated in FIG. 4, transistor Q7 initiates the operation of a second controlling section 17 of the controlling stage of the DAC of the present invention. With its source node coupled to $V_{cc}$, its gate node tied to its lower-potential drain node and transistor Q8 on, transistor Q7 is always on. In addition to being coupled to the current-regulating transistor Q8, the drain node of transistor Q7 is also coupled to the base nodes of transistors Q9 to Q12. With the bases of those transistors at a potential of $V_{cc}$ minus the gate-to-source voltage drop of transistor Q7, and the collectors of those transistors at $V_{cc}$, transistors Q9 to Q12 remain on. Their emitter nodes are coupled to node 724, thereby providing the gate of transistor M128 with a constant bias equal to $V_{cc}$ minus the base-to-emitter voltage drop across those transistors. Since transistors Q9 to Q12 are in parallel, the potential at node 724 can be said to be $V_{cc}$ minus the sum of gate-to-source voltage drop $V_{gs}$ of transistor Q7 and the base-to-emitter voltage drop $V_{BE}$ of transistor set Q9 to Q12. Tail resistors R9 to R12 ensure that any current from node 724 to the controlling stage is diverted to GND.

The discussion of the operation of the controlling stage of the DAC with specific reference to single cell 128 as shown in FIG. 4 can be expanded to include a description of the control of all other cells of the DAC described herein. That is, the same stable, continuous first controlling section 15 of the controlling stage including the transistors 715 and 730 can be used to set up the control of all the other cells. Input 733 can be used to mirror the supply to the current sources of the other cells, much in the same way that input 733 supplies sources 840 and Q7G of cell 128. In addition, the portion of the first controlling section 15 including transistors Q7 and Q8 can be used to mirror a constant bias to the bases of transistor stages of the second controlling sections of other cells, in the same fashion that second controlling section 17 includes transistor stage Q9 to Q12. That mirroring of the potential at the drain of transistor Q7 ensures that the same voltage level will ultimately be supplied to the gates of the output transistors of each of the cells. The fixed reference voltage $V_{cc}$ minus $V_{gs}$ minus $V_{BE}$ for the transistor(s) equivalent to transistors Q9 to Q12 guarantees that all cells will have output transistors with control nodes at the same potential.

In order for each of the output transistors of the given cells to switch with essentially the same switching speed, it is necessary to provide the capability to charge and discharge the gate of the output transistor of a particular cell with the same speed for all output transistors. That is, the gate-controlling transistors for the output transistors of each cell must be able to charge (or discharge when necessary) the gates of the corresponding output transistors in essentially the same time period. Therefore, output transistor M128 of cell 128, which is charged by the four gate-controlling transistors Q9 to Q12, has essentially the same charging rate that two transistors of the same size would achieve for the output transistor of cell 64. This follows from the difference in size between the output transistor of such a cell and transistor M128, as noted earlier.

In order to understand the operation of the DAC of the present invention, it can be seen that a logic high (H) (corresponding to "1" in the eighth place of the eight-bit number) input at in(7) of FIG. 1 will result in an input at cell 128 of FIG. 3 of H at input IN for transistor Q7A and the complementary logic signal low (L) at input INB for transistor Q7B. Under that condition, transistor Q7A is conducting, transistor Q7B is not, and so source-controlling transistors M128A, M128B, and M128C will have their bases at the potential of $V_{cc}$. Transistors M128A, M128B, and M128C are always conducting and will provide a potential to the source node of output transistor M128 that is equal to $V_{cc}$ (or a reference voltage) minus $V_{BE}$. At the same time, the gate-controlling transistors Q9 to Q12 provide a fixed, continuous potential to the gate node of output transistor M128 that is equal to $V_{ref}$ minus $V_{gs}$ of transistor Q7 minus $V_{BE}$. In the preferred embodiment of the present invention, $V_{gs}$ is approximately 800 millivolts. Therefore, the potential difference between the source and gate of transistor M128 is approximately 800 millivolts. For a typical high-potential power rail $V_{cc}$ at 5.0 volts (or an alternative reference voltage of approximately 4.2 volts), the noted potential difference between the source and gate of M128 is sufficient to turn that transistor on. With transistor M128 on, there is current passed through to lead 210. Because output transistor M128, like all of the other output transistors of the DAC, is of a unique size, it will deliver a unique current to lead 210, corresponding to the place value of the binary input at input in(7).

When the signal at input in(7) is at logic L (corresponding to a "0" in the eighth place of the eight-bit number), terminal INB of FIG. 3 is at logic H, terminal IN is at logic L, transistor Q7B is conducting, and transistor Q7A is non-conducting. Under those conditions, the bases of transistors Q9 to Q12 are at potential $V_{cc}$ minus the voltage drop across resistor 850. Since an initial logic L input is used to turn the cell output transistor M128 off, it is necessary to design resistor 850, or any other similar voltage dividing element in that location, so that the potential at the source of transistor M128 drops to or near the constant potential at that transistor's gate. Therefore, resistor 850 is preferably designed to provide a voltage drop of approximately 800 millivolts, corresponding to the 800 millivolt drop of $V_{gs}$ of transistor Q7. In that situation, output transistor M128 is held non-conducting and so it provides no current to the summing lead 210.

Because the output transistor M128 is kept in a condition such that when it is on it is just barely on and when it is off it is just barely off—by about 800 millivolts either way in the preferred embodiment of the invention—the switching rate is very fast and involves very short swings. Under these conditions there is very little noise in the operation of the device. Also, the DAC can be operated over a wide range of frequencies.

Figure 5:
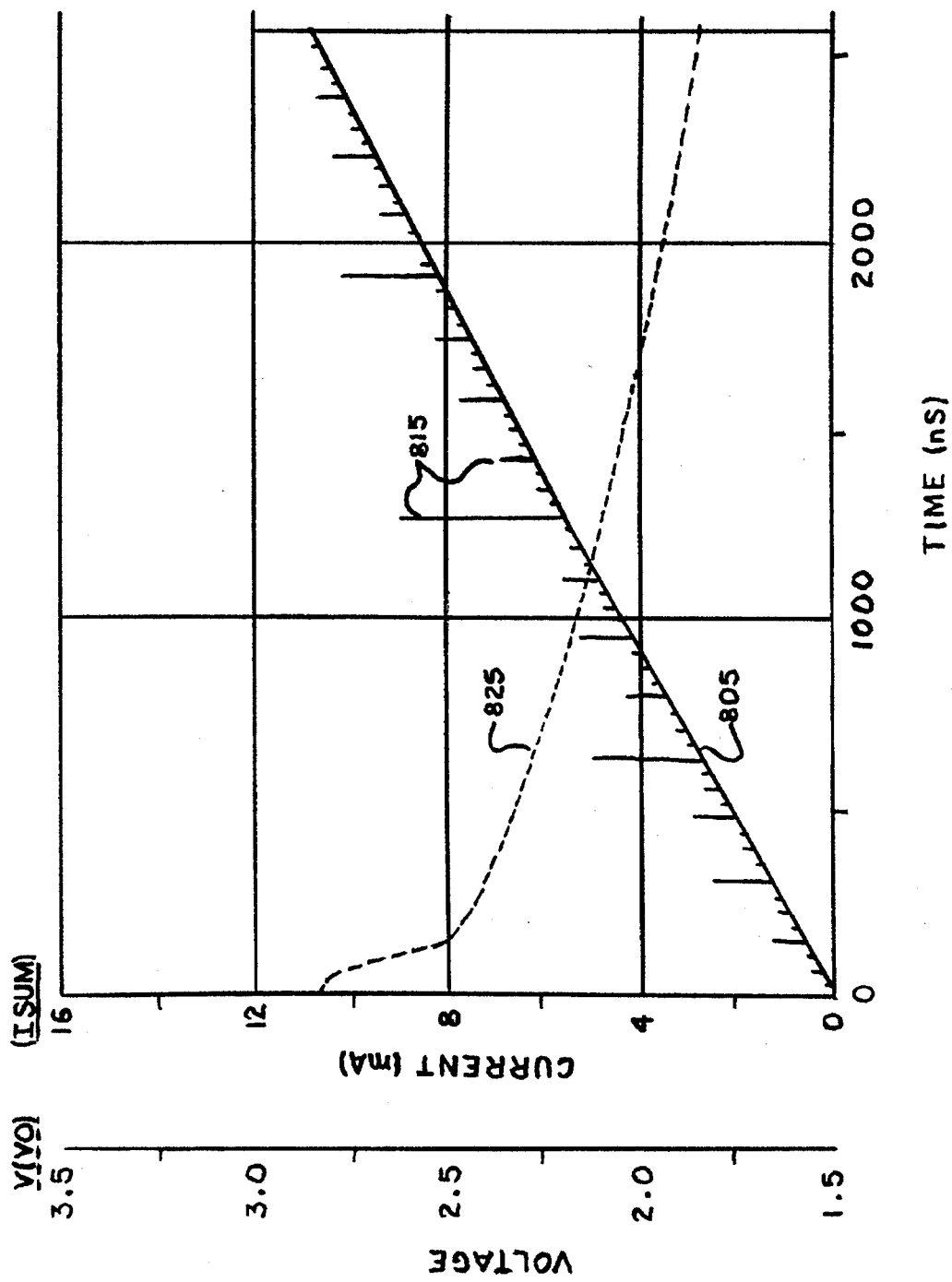
FIG. 5 is a graph of output current and output voltage as a function of time for the Digital-to-Analog Converter of the present invention as the input cycles uniformly from 00000000 through 11111111.

The invention as described results in a DAC that has little noise, desirable linearity, and suitable monotonicity, as evidenced by the curves of FIG. 5 for a cycling of the input signals corresponding to the range 00000000 (0) to 11111111 (255) for the DAC shown in FIG. 1. From the $I_{sum}$ curve 805 in that figure it can be seen that the design of the present invention provides a DAC with exceptional linearity and "noise" spikes 815 of extremely short duration. It is to be noted that these noise spikes 815 illustrate the short swings sufficient to turn the various output transistors on and off in order to effect the particular output current desired. The noise spikes 815 shown are positive, indicating that the turn on time is slightly faster than the turn off time. Even these brief spikes can be eliminated by including a capacitance in conjunction with the sense amplifier 550 previously described. For the invention shown in FIG. 2, the analog output voltage is shown by curve 825.

Although the preferred embodiment of the present invention has been described herein, the above description is merely illustrative. Further modification of the invention herein disclosed will occur to those skilled in the respective arts and all such modifications are deemed to be within the scope of the invention as defined by the appended claims.

What is claimed is:

1. An apparatus for converting a digital input signal to an analog signal, said apparatus comprising:
    a. a master transistor system; and
    b. one or more conversion cells, each conversion cell comprising:
        i. a digital signal input node for receiving a digital input signal;
        ii. a gate-controlling transistor having a control node coupled to said master transistor system;
        iii. a source-controlling transistor having a control node coupled to said digital signal input node; and
        iv. an output transistor having a gate node coupled to a low-potential node of said gate-controlling transistor, a source node coupled to a low-potential node of said source-controlling transistor, and a drain node coupled to an analog current summation lead.

2. The apparatus as claimed in claim 1, said master transistor system comprising a master transistor having a high-potential node coupled to a high-potential power rail and a low-potential node coupled to said control node of said gate-controlling transistor.

3. The apparatus as claimed in claim 2 further comprising a current source coupled between said low-potential node of said master transistor and a low-potential power rail.

4. The apparatus as claimed in claim 3 with said current source comprising a bipolar transistor having a base node coupled to a constant reference voltage source.

5. The apparatus as claimed in claim 2 wherein said master transistor is a PMOS transistor having a source node coupled to said high-potential power rail, said PMOS transistor having its gate node coupled to its drain node, and said drain node of said PMOS transistor coupled to said control node of said gate-controlling transistor.

6. The apparatus as claimed in claim 5 wherein said source-controlling transistor is a bipolar transistor having a collector node coupled to said high-potential power rail, a base node coupled to said digital signal input node, and an emitter node coupled to said source node of said output transistor and to a low-potential power rail.

7. The apparatus as claimed in claim 6 further comprising a current source coupled between said emitter node of said source-controlling transistor and said low-potential power rail.

8. The apparatus as claimed in claim 7 with said current source comprising a bipolar transistor having a collector node coupled to said emitter node of said source-controlling transistor, a base node coupled to a constant reference voltage source, and an emitter node coupled to said low-potential power rail.

9. The apparatus as claimed in claim 1 with each conversion cell further comprising a first bipolar input transistor and a second bipolar input transistor, with a base node of said first bipolar input transistor coupled to said digital input signal, a base node of said second bipolar transistor coupled to an output of an inverter delivering a signal complement to said digital input signal, a collector node of said first bipolar transistor coupled to said control node of said source-controlling transistor, a collector node of said second bipolar transistor coupled to said control node of said source-controlling transistor, and with said first bipolar input transistor and said second bipolar input transistor having a common emitter.

10. The apparatus as claimed in claim 9 further comprising a voltage-reduction device coupled between said collector node of said second bipolar input transistor and a high-potential power rail.

11. The apparatus as claimed in claim 10 wherein said voltage-reduction device is a resistor having a high-potential node coupled to said high-potential power rail and a low-potential node coupled to said collector node of said second bipolar input transistor and to said control node of said source-controlling transistor.

12. A phase lock loop system having a first connecting node and a second connecting node, said phase lock loop system having an apparatus for converting digital signals into analog signals, said apparatus comprising:
  a. a master transistor system; and
  b. a plurality of conversion cells, each conversion cell comprising:
    i. a digital signal input node for receiving a digital input signal from said first connecting node of said phase lock loop system;
    ii. a gate-controlling transistor having a control node coupled to said master transistor system;
    iii. a source-controlling transistor having a control node coupled to said digital signal input node; and
    iv. an output transistor having a gate node coupled to a low-potential node of said gate-controlling transistor, a source node coupled to a low-potential node of said source-controlling transistor, and a drain node coupled to an analog current summation lead, wherein said current summation lead is coupled to said second connecting node of said phase lock loop system.

13. The phase lock loop system as claimed in claim 12 with said master transistor system of said apparatus comprising a PMOS transistor having its gate node shorted to its drain node, a source node coupled to a high-potential power rail, and said drain node of said PMOS transistor coupled to said control node of said gate-controlling transistor.

14. The phase lock loop system as claimed in claim 13 wherein said gate-controlling transistor of said apparatus is a bipolar transistor having a collector node coupled to said high-potential power rail, a base node coupled to said drain node of said PMOS transistor, and an emitter node coupled to a low-potential power rail.

15. The phase lock loop system as claimed in claim 14 wherein said source-controlling transistor of said apparatus is a bipolar transistor having a collector node coupled to said high-potential power rail, a base node coupled to said digital input signal node, and a drain node coupled to said source node of said output transistor.

16. The phase lock loop system as claimed in claim 15 wherein said output transistor is a second PMOS transistor having a drain node coupled to said current summation lead.

17. A method for converting a digital input signal to an analog output signal, said method comprising the steps of:
  a. establishing a constant master current;
  b. delivering said constant master current to a gate node of an output transistor, said output transistor having particular operational characteristics so that said output transistor corresponds uniquely to said digital input signal;
  c. transmitting said digital input signal to a source node of said output transistor so as to control when said output transistor is on or off; and
  d. delivering an analog output current from a drain node of said output transistor to an analog summation lead.

18. The conversion method as claimed in claim 17 with the step of transmitting said digital input signal to said output transistor comprising the steps of:
  a. transmitting said digital input signal to a base node of a first bipolar input transistor;
  b. transmitting to a base node of a second bipolar input transistor a second input signal wherein said second input signal is a complement of said digital input signal;
  c. connecting a collector node of said first bipolar input transistor and a collector node of said second bipolar input transistor to a base node of a source-controlling bipolar transistor so that when said digital input signal is of a first logic state said source-controlling transistor is on, and when said digital input signal is of a second logic state said source-controlling transistor is off; and
  d. connecting an emitter node of said source-controlling transistor to said source node of said output transistor.

19. The conversion method as claimed in claim 18 further comprising the step of connecting a voltage-reduction device between said collector node of said second bipolar input transistor and a high-potential power rail.

20. The conversion method as claimed in claim 19 wherein said voltage reduction device is a resistor with a high-potential node coupled to said high-potential power rail and a low-potential node coupled to said collector node of said second bipolar input transistor.

* * * * *